United States Patent [19]
Tanaka et al.

[11] Patent Number: 4,961,197
[45] Date of Patent: Oct. 2, 1990

[54] SEMICONDUCTOR LASER DEVICE

[75] Inventors: Toshiaki Tanaka, Kokubunji; Takashi Kajimura, Tokyo; Toshihiro Kawano, Ome; Yuichi Ono, Tokyo, all of Japan

[73] Assignee: Hitachi, Ltd., Tokyo, Japan

[21] Appl. No.: 339,125

[22] Filed: Apr. 14, 1989

[30] Foreign Application Priority Data

| | | | |
|---|---|---|---|
| Sep. 7, 1988 | [JP] | Japan | 63-222310 |
| Sep. 14, 1988 | [JP] | Japan | 63-228670 |
| Oct. 19, 1988 | [JP] | Japan | 63-261485 |
| Jan. 10, 1989 | [JP] | Japan | 01-1392 |
| Mar. 1, 1989 | [JP] | Japan | 01-46503 |

[51] Int. Cl.$^5$ .............................. H01S 3/19
[52] U.S. Cl. .................... 372/45; 372/46; 357/4; 357/17
[58] Field of Search ........... 372/45, 46, 43; 357/4, 357/16, 17

[56] References Cited

U.S. PATENT DOCUMENTS

| | | | |
|---|---|---|---|
| 4,740,976 | 4/1988 | Kajimura et al. | 372/46 |
| 4,845,724 | 7/1989 | Hayakawa et al. | 372/46 |

FOREIGN PATENT DOCUMENTS

| | | | |
|---|---|---|---|
| 0145686 | 8/1985 | Japan | 372/45 |
| 0145687 | 8/1985 | Japan | 372/45 |
| 0154191 | 7/1986 | Japan | 372/45 |

OTHER PUBLICATIONS

Appl. Phys. Lett., 45(8), Oct. 15, 1984, pp. 836-837.
IECE Technical Report on Optical and Quantum Electronics, OQE, 88-5, pp. 33-38.

*Primary Examiner*—William L. Sikes
*Assistant Examiner*—Georgia Y. Epps
*Attorney, Agent, or Firm*—Kenyon & Kenyon

[57] ABSTRACT

A high-power low-noise semiconductor laser device required for light sources for an erasable optical disc is a self-sustained pulsating semiconductor laser device in which an MQW structure is used for an active layer, and thus a kink output power and a light output power by which the self-pulsation is enabled are increased to 10 mW or more and noise is reduced. Another semiconductor laser device of a self-pulsation type has impurities that are doped in the active layer to reduce the self-pulsating frequency to obtain a low-noise characteristic even if higher optical feedback occurs.

27 Claims, 10 Drawing Sheets

CONDUCTION BAND

VALENCE BAND

SEMICONDUCTOR LASER DEVICE259

BACKGROUND OF THE INVENTION

The present invention relates to semiconductor laser devices and methods of manufacturing the same. More particularly to such devices which have high-power low-noise characteristics effective for use as optical sources for erasable optical discs and methods of manufacturing such devices.

Self-sustained pulsating semiconductor laser devices are used as low-noise semiconductor laser devices. However, in conventional self-sustained pulsating semiconductor laser devices, the kink power and the maximum optical output which enables the self-sustained pulsation is low, for example, about 7-9 mW, as disclosed in Japanese papers, *IECE TECHNICAL REPORT ON OPTICAL AND QUANTUM ELECTRONICS*,OQE 84-57 (1984), pp. 39-46 and OQE 84-30, pp. 65-72.

Self-sustained pulsating semiconductor laser devices having an active layer of a double heterostructure and an active layer of a multiquantum well structure and the characteristics thereof are disclosed, for example, in the Inventors' article entitled "Self-sustained Pulsating Semiconductor Lasers with a Ridge Stripe Structure", Japanese paper, *IECE TECHNICAL REPORT ON OPTICAL AND QUANTUM ELECTRONICS*, OQE 88-5 (1988), pp. 33-38. The technique disclosed in this report is incorporated in the present invention.

Conventionally, the single quantum well structure of the semiconductor lasers is mainly used for reducing their threshold current. In addition, a pair of superlattice waveguides are provided one on an upper surface of the single quantum well active layer and the other on a lower surface of the layer in order to improve the flatness and crystallinity of the quantum well interface. Semiconductor laser devices of this type are disclosed, for example, in Japanese paper, EXTENDED ABSTRACTS (*THE 46TH AUTUMN MEETING, 1985*), *THE JAPAN SOCIETY OF APPLIED PHYSICS*, 1P-N-8, P. 196.

Self-sustained pulsating semiconductor lasers are conventionally suitable for low-noise semiconductor lasers required as optical sources for light video discs, etc. The characteristics of the self-sustained pulsating semiconductor lasers are addressed, for example, in Japanese paper, *IECE TECHNICAL REPORT ON OPTICAL AND QUANTUM ELECTRONICS*, OEQ 84-30, pp. 65-72. As described above these semiconductor lasers, the kink power and the optical output power which enables self-sustained pulsation are low, and 7-9 mW. In addition the control of the self-pulsating frequency is not studied and the frequency is high, for example, about 1 GHz.

Conventionally, an optical waveguide is etched with an etchant to form a ridge stripe structure, and the control of the thickness of the waveguide has been provided by setting an etching time in consideration of the etching rate of an etchant. References concerned are, for example, Japanese papers, *EXTENDED ABSTRACTS (THE 35TH SPRING MEETING, 1988), JAPAN SOCIETY OF APPLIED PHYSICS AND RELATED SOCIETIES*, 31p-ZP-17 (1988), p. 912 and *IECE TECHNICAL REPORT ON OPTICAL AND QUANTUM ELECTRONICS*, OQE 88-5 (1988), pp. 33-38.

SUMMARY OF THE INVENTION

The above conventional techniques do not address measures to increase to 10 mW or more the kink power and the optical output power which enables the self-pulsation, and do not provide a high-power low-noise characteristic at high power.

It is an object of the present invention to provide a semiconductor laser device which has a high-power low-noise characteristic required for a light source for optical discs.

It is another object of the present invention to provide a semiconductor laser device which has a high-power low-noise characteristic by optimizing parameters specifically for the structure of a self-sustained semiconductor laser device, and which is especially suitable for an optical source for erasable light discs.

It is still another of the present invention to provide a semiconductor laser device which has measures for the lateral mode stabilization of a laser beam and the longitudinal mode control depending on the transverse refractive index difference of the active layer, and which satisfies the high-power low-noise characteristic.

It is a yet another object of the present invention to provide a semiconductor laser device which has a high-power low-noise characteristic suitable for a light source for optical discs to thereby suppress optical feedback noise generated when optical feedback to the laser device occurs and hence to provide a low-noise characteristic in which the relative intensity noise is maintained at $10^{-13}$ Hz$^{-1}$ or less from a low to a high laser output power even if a quantity of optical feedback is large.

It is a still yet another object of the present invention to contemplate means to control the thickness of a cladding layer which greatly influences the basic characteristics of a laser device in fabricating a ridge stripe structure and to realize a desired cladding layer thickness using a cladding layer processing method in which the temperature and composition of an etchant used and the time interval during which the etchant is used do not significantly influence the cladding layer, and hence to prevent a possible deterioration in the semiconductor laser characteristic which would be caused by an etch-stop layer provided in the processing method.

The first object of the present invention is achieved by fabricating the active layer of the self-sustained pulsating laser device as a multiquantum well structure. More specifically, the object is achieved by a semiconductor laser device including a double heterojunction semiconductor layer which includes an active layer of a bandgap semiconductor material and a pair of cladding layers of a larger-bandgap semiconductor material, one on each of an upper and a lower surfaces of the active layer. The semiconductor layer on the upper surface of the active layer is etched so as to form a central ridge stripe, and a current-blocking and light-absorbing layer are provided by crystal growth on each of both the sides of the central ridge portion by crystal growth to control the effective transverse refractive index difference of the active layer to a desired value. The active layer having a predetermined multiquantum well structure.

The multiquantum well structure active layer can have a structure of alternate quantum barriers and quantum wells and can be 0.05-0.09 μm thickness in total.

The quantum barrier may be 3-7 nm broad and the quantum well may be 5-20 nm broad.

The distance between the multiquantum well active layer and the current blocking and light-absorbing layer can be 0.3–0.7 μm;

The ridge-like cladding layer provided on the upper surface of the multiquantum well active layer is 1.2–1.8 μm thick.

The ridge-like cladding layer provided on the upper surface of the multiquantum well active layer can be formed by etching, and the ridge bottom width can be greater than the ridge top width.

The ridge top width can be 2–5 μm, and the ridge bottom width can be 4–8 μm.

In the self-sustained pulsating semiconductor laser device, the effective transverse refractive index difference of the active layer is an important parameter which is controlled to provide a self-sustained pulsation. In the conventional self-sustained laser device, the active layer uses a bulk crystal. Since a decrease in the refractive index due to carrier injection is large, the built-in refractive index difference is lost at a relatively low injection level. Therefore, the lateral mode would become unstable at a low optical power output, and a kink would occur and/or the self-sustained pulsation would be lost.

According to the present invention, since the active layer has a multiquantum well structure, the kink power and self-sustained pulsating output power are improved compared to regular bulk active layers. This is because the use of the multiquantum well structure reduces a carrier-injection induced refractive index change in the active layer compared to conventional bulk active layer, and thus the lateral mode is stabilized without significantly losing the built-in refractive index difference in the active layer up to a higher injection level. In order to cause a self-sustained pulsation, structural parameters such as the overall thickness of the multiquantum well layer, the widths of the quantum wells and quantum barriers, etc., must be corresponding predetermined values. In order to control within an area in which self-sustained pulsation is available the effective transverse refractive index difference of the active layer, which is an important parameter to provide a self-sustained pulsating laser device, the overall thickness of the multiquantum well layer should be 0.05–0.09 μm and the quantum well width should be 5–20 nm, and the quantum barrier width should be 3–7 nm.

The second object of the present invention is achieved by a self-sustained pulsating semiconductor laser in which the respective structural parameters of the active layer, the cladding layer and the stripe structure are optimimized.

The active layer employs a single- or multiquantum well structure, which produces a quantum size effect, rather than conventional double junction structure. The stripe structure employs a ridge stripe which has a trapezoidal cross section configuration which has an upper horizontal side shorter than a lower horizontal side. This is realized by burying the ridge stripe in a current-blocking and light-absorbing layer such that the current blocking width (the upper horizontal side of the trapezoidal cross section configuration of the ridge stripe) is smaller than the optical waveguide width (the lower horizontal side of the trapezoid), and adjusting the height of the ridge stripe to control the effective transverse refractive index difference of the active layer.

The semiconductor laser device according to the present invention includes a semiconductor substrate, and a lower cladding layer, an active layer and an upper cladding layer provided in this order above the substrate, wherein the energy bandgaps of the upper and lower cladding layers are larger than that of the active layer. The active layer has a single- or multi-quantum well structure of at least one quantum well of a thickness corresponding to the electron de Broglie wavelength or less, that is, 10–30 nm thick. Integrally provided substantially at the center of the upper surface of the upper cladding layer is a ridge stripe having a trapezoidal cross section in which the upper horizontal side is shorter than the lower horizontal side. A current blocking layer is buried on each of both the sides of the ridge stripe and on the upper surface of the upper cladding layer. The thickness of the portions of the upper cladding layer in which no ridge stripes are formed is controlled such that the effective refractive index difference between the area below the ridge stripe and other areas in the active layer is $8 \times 10^{-4}$–$5 \times 10^{-3}$.

Desirable structural parameters will now be described.

If the active layer includes a single quantum well structure, it includes a pair of quantum barriers or graded-index layers one on each of both the upper and lower surfaces of the quantum well while if the active layer has a multiquantum well structure, it includes alternating quantum wells and quantum barriers or graded-index layers. The overall thickness of the active layer including the quantum wells and quantum barriers or graded-index layers is 0.05–0.08 μm.

The length of the upper horizontal side of the trapezoid (current blocking width) is 2–4 μm and the length of the horizontal bottom side (optical waveguide width) is 4–7 μm.

The cross-sectional configuration of the ridge stripe is trapezoidal and symmetrical with reference to its vertical center line, and the difference in length between the upper and lower horizontal sides of one right or left half of the trapezoid is 0.6–2.0 μm.

The portions of the upper cladding layer on which no ridge stripes are formed are 0.2–0.6 μm thick.

The portion of the upper cladding layer on which the ridge stripe is formed is 1.0–3.0 μm thick.

The ridge stripe may additionally include a second layer provided on the upper cladding layer and of the same conductive type as the upper cladding layer.

The current blocking layer is flush with the ridge stripe.

The current blocking layer is formed by selective growth process on the upper cladding layer on each of both the sides of the ridge stripe.

The whole active layer is doped with at least one of p- or n-type impurities with its impurity doping level being $1 \times 10^{18}$–$1 \times 10^{19}$ cm$^{-3}$.

Alternatively, only the quantum barrier of the active layer is doped with at least one of n- and p-type impurities with its impurity doping level being $1 \times 10^{18}$–$1 \times 10^{19}$ cm$^{-3}$.

The single- or multiquantum well structure is made of AlGaAs. The quantum well has a composition of $Al_x Ga_{1-x}As$ where $0 \leq x \leq 0.15$, and the quantum barrier has a composition of $Al_y Ga_{1-y}As$ where $0.20 \leq y \leq 0.35$.

By the adoption of the above structure and parameters in the semiconductor laser device, the laser device performs a stabilized self-sustained pulsation in an optical output power of 2–10 mW with high reproducibility, and provides an increased kink output power of at least 90–100 mW. Therefore, in a semiconductor layer device having a ridge stripe structure, stabilized self-sustained pulsation is obtained with high reproducibility by controlling the effective in refractive index difference between the area below the ridge stripe in the active layer and other areas within $8 \times 10^{-4}$–$5 \times 10^{-3}$ with the overall thickness of the active layer being 0.05–0.08 μm, and with the thickness of the portion of the upper cladding layer in which no ridge stripes are formed being 0.2–0.6 μm. A quantum well structure employed in a active layer has the small refractive index change due to carrier injection. Thus, the laser beam can be guided up to a high carrier injection level, namely, until a high optical output power is obtained compared to the conventional device, without losing the initial built-in refractive index difference in which the stabilized fundamental lateral mode is obtained.

In order to control the optical output power range which enables self-sustained pulsation and to improve the kink power by hole burning, it is necessary to further optimize the device structure. To this end, it is important that the thickness of the active layer should be 0.055–0.070 μm, that the thickness of the cladding layer should be 0.3–0.5 μm, and that the lower width of the ridge stripe (the length of the horizontal bottom side of the trapezoid) should be 4–6 μm.

In order to achieve the third object of the present invention, a laser device is provided in which the active layer includes a single-quantum well layer and a pair of superlattice layers one on each of both the upper and lower surfaces of the well with the composition, thickness and impurity levels of the respective layers being selected at corresponding predetermined values.

In order to provide a self-sustained pulsation laser device, a ridge stripe structure is formed and the effective transverse refractive index difference of the active layer is controlled to be a predetermined value.

Obtaining a high-power low-noise characteristic necessary for a light source for writing and erasing data in optical discs and a light source for reading data will now be described.

Conventionally, it is known that by the use of a single quantum well structure in the active layer the threshold current for the laser oscillation is reduced. As disclosed in *APPL. PHYS. LETT.* 45 (1984), p. 836, a laser device having a single quantum well active layer is smaller in the reduction of the refractive index due to carrier injection than a laser device having a regular double heterostructure or a multiquantum well active layer. This suggests that the laser device having a single-quantum well active layer has a high-power characteristic in which the kink power is high without rendering unstable the built-in effective transverse refractive index difference of the active layer up to a high carrier injection level. However, since the single-quantum well active layer is thin, the laser beam greatly expands into the cladding layer. Thus the effective transverse refractive index difference of the active layer would increase undesirably in a laser device in which the optical absorption layer is provided to control the lateral mode. Another problem is that the control of a longitudinal mode by the control of the refractive index difference is difficult. In the self-sustained pulsating laser having an excellent low-noise characteristic, in which the relative intensity noise is, for example, $10^{-14}$–$10^{-13}$ Hz even if optical feedback generates, the effective transverse refractive index difference of the active layer is about $1 \times 10^{-3}$–$5 \times 10^{-3}$. Therefore, in order to realize a self-sustained pulsating laser, the control of the effective transverse refractive index difference of the active layer is important. This refractive index difference can be controlled by the thicknesses of the active layer and cladding layer of the device.

In the present invention, since a superlattice layer is provided on each of both the upper and lower surfaces of the single-quantum well layer, the wave-function of electrons and holes as carriers is not confined within the single-quantum well layer, but greatly leaks out to each of both the sides of the single-quantum quantum well layer. As a result, the expansion of a far field pattern of laser beam distribution in the active layer is small compared to the conventional single-quantum well active layer. The width of the single-quantum well layer preferably has a relatively large value within a range, for example, of 10–30 nm, in which a quantum size effect is produced. As just described above, by controlling the laser beam distribution and providing the optical absorption layer at a predetermined position from the active layer, the effective transverse refractive index difference of the active layer can be realized at a desired value. By such control of the refractive index difference, the self-sustained pulsating laser device is fabricated. Since a decrease in the refractive index due to carrier injection is small in the single quantum well layer, the built-in refractive index difference is not lost up to a high injection level and an output characteristic is obtained in which the kink power is high in a stabilized fundamental lateral mode.

The fourth object of the present invention is achieved by a self-sustained pulsating semiconductor laser device in which at least n-type impurities are doped in the bulk active layer or multiquantum well active layer. More particularly, it is achieved by a semiconductor laser device including a heterojunction semiconductor layer which includes a semiconductor active layer, a pair of semiconductor layers one on each of both the upper and lower surfaces of the active layer, a ridge step formed in the upper cladding layer, a pair of current blocking and light-absorbing layers one on each of the sides of the ridge to control the effective transverse refractive index difference of the active layer. Impurities are doped in the set bulk active layer or multiquantum well active layer.

The impurities are uniformly doped in the whole bulk active layer or in the whole multiquantum well active layer.

Either n-type impurities are doped in either the bulk active layer or in the multiquantum well active layer, or n- and p-type impurities are doped simultaneously either in the bulk active layer or in the multiquantum well active layer. The impurities to modulation-doped either in the quantum barrier alone or in the quantum well alone in the multiquantum well active layers.

The semiconductor laser device may have n-type impurities that are doped in the quantum barrier alone in the multiquantum well active layer, or n- and p-type impurities that are doped simultaneously in the quantum barrier alone in the multiquantum well active layer, or n-type impurities that are doped in the quantum well alone or n- and p-type impurities that are doped simultaneously in the quantum well alone.

The semiconductor laser device may have impurities that are modulation-doped either in the quantum barrier or in the quantum well of the multiquantum well active layer, and the layer in which the impurities are doped is narrower than the quantum barrier or the quantum well.

The laser device may include an area narrower than the quantum barrier or quantum well of the multiquantum well active layer and in which either n-type impurities are doped or n-and p-type impurities are doped simultaneously which is formed in the quantum barrier or the quantum well of the multiquantum well active layer, and both areas outside the doped area in the quantum barrier or the quantum well are free from impurity doping.

The density of impurities doped in the bulk active layer or in the multiquantum well active layer can be $7 \times 10^{18} - 1 \times 10^{19}$ cm$^{-3}$ in n-type and $5 \times 10^{17} - 5 \times 10^{18}$ cm$^{-3}$ in p-type.

The impurities doped in the bulk active layer or in the multiquantum well active layer can be Se or Si in n-type and Be or Mg in p-type.

The quantum barrier of the multiquantum well active layer can be 3–7 nm broad, and the quantum well can be 5–20 nm broad;

The multiquantum well active layer can be 0.05–0.09 μm thick.

The multiquantum well active layer can have a graded index separate confinement heterostructure.

The plane orientation of the semiconductor substrate in which crystals grow can be (111).

If optical feedback is high even in a self-sustained pulsating semiconductor laser excellent in low-noise characteristic, optical feedback noise would be produced and the relative intensity noise would exceed $10^{-13}$ Hz$^{-1}$, as disclosed, for example, in Japanese paper, *EXTENDED ABSTRACTS (THE 35TH SPRING MEETING, 1988), THE JAPAN SOCIETY OF APPLIED PHYSICS AND RELATED SOCIETIES*, 31p-ZP-16, 31p-ZP-18 (1988), p. 912. The optical feedback noise in this case is related to the timing of the optical feedback occurrence in the device, and is determined by the self-pulsating frequency and optical pickup optical cavity length of the device. In the case of an optical video disc having optical cavity length of 60 mm, it is necessary to set the self-pulsating frequency of the device to 1.3 GHz or less in order to prevent optical feedback noise from being induced. Namely, it is important to control the self-pulsating frequency in order to obtain a low-noise charactristic.

According to the present invention, the self-pulsating frequency of the self-sustained pulsating semiconductor laser device is reduced by doping n-type impurities in the bulk active layer or the multiquantum well active layer in the device. The reason for this will now be described. Considering that the self-sustained pulsation of the semiconductor laser device is likely to resonate at a frequency similar to that of its relaxation oscillation, the self-pulsating frequency can be described using an equation similar to that representing the relaxation oscillation frequency. The self-pulsating frequency fp is given by $$f_p = K \left[ \frac{dg}{dn} \frac{1}{\tau_p} \left( \frac{1}{I_{th}} - 1 \right) \right]^{\frac{1}{2}} \quad (1)$$

$$\frac{1}{\tau_p} = \frac{C}{n_r} \left( \alpha_i + \frac{1}{2L} \ln \frac{1}{R_1 R_2} \right) \quad (2)$$

where K is the constant, dg/dn is the differential gain, $\tau_p$ is the photon lifetime, I is the injected current, $I_{th}$ is the threshold current, C is the photon velocity, $n_r$ is the effective refractive index, $\alpha_i$ is the internal loss, L is the cavity length, and $R_1$ and $R_2$ are the facet reflectivities.

For example, as disclosed in Japanese paper, *IECE TECHNICAL REPORT ON OPTICAL AND QUANTUM ELECTRONICS* OQE86-63, pp. 17–24, if the active layer has a multiquantum well structure, the differential gain increases, and hence the self-pulsating frequency increases compared to the regular bulk active layer such that the relaxation oscillation frequency increases. In order to reduce the self-pulsating frequency, it would be effective to increase the photon lifetime by increasing the cavity length and the facet reflectivities in the above equations (1) and (2) as well as to reduce the differential gain. The reduction of the differential gain is achieved by doping n-type impurities in the multiquantum well active layer. Thus, electrons are supplied contributing to recombination emission even if carriers are not injected in the active layer, and thus it is possible to obtain a gain in a wider energy area than a regular one. Therefore, the gain spectrum expands, a rise in the gain due to carrier injection, namely, the differential gain, is reduced compared to the undoped active layer.

If the multiquantum well layer is uniformly doped with impurities, an adverse effect may occur such as occurrence of an unstable pulsating wavelength due to deformation of the quantized energy level formed in the quantum well by the space charges of impurity ions or disturbance of distribution of the gain spectra. Therefore, it is effective to either perform modultion doping in the quantum barrier alone in the quantum barrier or perform δ-doping in the central portion alone without doping in the quantum well.

If the overall thickness of the multiquantum well layer decreases, a multi-longitudinal mode self-pulsation is not obtained, and a single-longitudinal mode oscillation tends to occur. An appropriate overall thickness of the multiquantum well layer is 0.05–0.09 μm. In addition, if the quantum well is thinned, a single-longitudinal mode oscillation tends to occur, and, even if a self-pulsating is obtained, the frequency would increase, so that an appropriate quantum well is 5–20 nm broad and preferably 8–12 nm broad.

According to the present invention, the self-pulsating frequency was reduced, so that a low-noise characteristic in which a relative noise intensity was $10^{-14} - 10^{-13}$ Hz$^{-1}$ was realized even in an optical output power higher than the conventional one even if an optical feedback quantity of 3–6% was generated.

The fifth object of the present invention directed to the cladding layer thickness control is achieved by providing a thin film etch-stop layer such that a cladding layer of a desired film thickness remains in the middle portion of the cladding layer provided on top of the active layer in crystal growth process. The etching rate is extremely low in the etch-stop layer compared to that in the cladding layer, so that a thin film in which the quantum size effect is produced and which functions satisfactorily as the etch-stop layer is provided.

Since the etch-stop layer is provided in the cladding layer, absorption loss may occur if the bandgap energy is lower than the laser energy, part of the laser beam may be guided by the etch-stop layer if the refractive index of the etch-stop layer is larger than that of the active layer, and thus the symmetry of distribution of the laser beam may be deteriorated. This problem is solved by disordering the compositions of the etch-stop layer and the cladding layer due to the interaction between these layers in a subsequent process such that the bandgap and refractive index of the etch-stop layer approach those of the cladding layer.

The operation of means for controlling the cladding layer thickness used in the formation of a ridge stripe structure and measures for countering adverse effects on the semiconductor laser characteristic caused by the use of the controlling means will now be described.

Among the crystal layers grown for the semiconductor laser device on its semiconductor substrate, the etch-stop layer having an etching rate largely different from the cladding layer is provided such that only a cladding layer of a desired thickness remains beforehand except in the ridge portion in the upper cladding layer in order to form a ridge stripe waveguide on the upper cladding layer provided on the active layer. If the upper cladding layer is chemically etched up to the etch-stop layer using a mask, a desired ridge stripe structure is formed with the accuracy of crystal growth conditions with high controllability.

Since the etch-stop layer is provided in the cladding layer close to the active layer, it would cause absorption loss or asymmetry of optical waveguide distribution if the etch-stop layer differs in composition from the cladding layer.

The following measures are taken to reduce the absorption loss of the laser beam by the etch-stop layer. By thinning the etch-stop layer to use the quantum size effect, the bandgap energy between the quantized energy levels is increased compared to the energy of the laser beam oscillation wavelength to thereby reduce the absorption loss.

However, it is impossible to satisfactorily reduce the absorption loss by only thinning the etch-stop layer. If the etch-stop layer is higher in refractive index than the cladding layer, the laser beam may be guided undesirably to the etch-stop layer. In order to prevent this, the compositions of the etch-stop layer and the cladding layer should be disordered.

To this end, as shown in FIG. 16, a crystal layer(s) 46 (46') is provided in which impurities are doped in high concentration in the crystal growth process on at least one of the upper and lower surfaces of the etch-stop layer 47, the impurities being of the same condutive-type as the upper cladding layer. The crystal layer is then etched chemically such that the etch-stop layer is reached, and then an n-type GaAs block layer 410 is selectively deposited. The half-finished product is then heated temporarily to a temperature of 800°-850° C. higher than the crystal growth temperature (650°-700° C.) by MOCVD (Metalorganic Chemical Vapor Deposition). By this annealing, impurities are diffused from the high density impurity layers 46 and 46'0 on the upper and lower surfaces of the etch-stop layer 47, and thus the compositions of the etch-stop layer 47 and the upper cladding layers are disordered due to the interaction therebetween as shown hatched in FIG. 16. As a result, the etch-stop layer area becomes close in composition to the cladding layers to thereby prevent the occurrence of absorption loss and the formation of asymmetrical optical waveguide.

Alternatively, as shown in FIG. 17, the cladding layer is etched up to the etch-stop layer, a p-type GaAs layer 414 is selectively grown in which the impurities are doped in high concentration, and an n-type GaAs block layer is selectively grown by MOCVD. Thereafter, the half-finished product is temporarily heated to 800°-850° C. higher than the crystal growth temperature of 650°-700° C. At this time, impurities are diffused out of the layer 414 to thereby disorder the compositions of the etch-stop layer 47 and the upper cladding layer 48.

The disordering of the compositions may be caused in a later annealing process after impurities are doped in high concentration in the etch-stop layer.

As mentioned above, in the present invention, the conventional drawbacks are solved only by adding the heating process in the crystal growth furnace compared to the conventional process.

DETAILED DESCRIPTION OF THE PRESENT INVENTION

EXAMPLE 1

Figure 1:
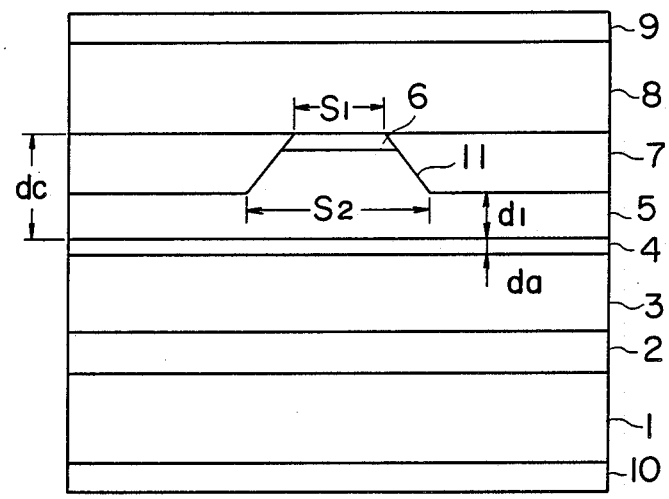
FIG. 1 is a cross section view of an MQW self-sustained pulsating laser device according to an embodiment of the present invention.

An MQW laser as an example 1 an embodiment of of the present invention will now be described with reference to FIG. 1. Sequentially formed by crystalline growth on an n-GaAs substrate by metal organic chemical vapor deposition (MOCVD) or molecular beam epitaxy (MBE) are an n-GaAs buffer layer 2 (0.5 μm thick), an n-Al$_x$Ga$_{1-x}$As cladding layer 3 (1.5 μm thick, x=0.45), an undoped AlGaAs MQW active layer 4 (an alternate laminate of five undoped $Al_yGa_{1-y}As$ quantum barriers (each being 3-5 nm thick, y=0.25-0.27) and four undoped $Al_zGa_{1-z}As$ quantum wells (each being 9-11 nm thick, z=0.04-0.06), a p-$Al_xGa_{1-x}As$ cladding layer 5 (1.5 μm thick, x=0.45), and a p-GaAs layer 6 (0.2 μm thick). Thereafter an insulator film is formed on top of the resulting half-finished product, and an insulator film mask of a stripe-like pattern is formed by photolithography and etching. By using this mask, a stripe-like ridge waveguide 11 is formed by wet etching using a hydrophosphoric acid solution. The thickness $d_1$ of the layer 5 except in the ridge after etching was selected to be 0.3-0.5 μm. Thereafter, the n-GaAs current blocking layer 7 (0.9 μm thick) is grown by selective recrystallization so as to be substantially flush with the ridge with the mask being left. Thus the current-blocking and light-absorbing layer is formed by crystal growth in a self-aligned manner. The insulator film mask is then etched away with a hydrofluoric acid solution, a p-GaAs contact layer (1.5 μm thick) is formed by crystalline growth. Thereafter, a p-side electrode 9 and an n-side electrode 10 are deposited and a device is cut away by cleaving and scribing.

The appropriate stripe width of the ridge 11 for providing a laser which oscillates in the fundamental lateral mode in a stabilized manner is 4-7 μm in bottom width $S_2$ and 3-5 μm in top width $S_1$.

For comparison, a regular double hetero (DH) laser was prepared using undoped $Al_{0.14}Ga_{0.86}As$ as an active layer. The laser had the same structural parameters as the example except for the active layer.

Figure 2:
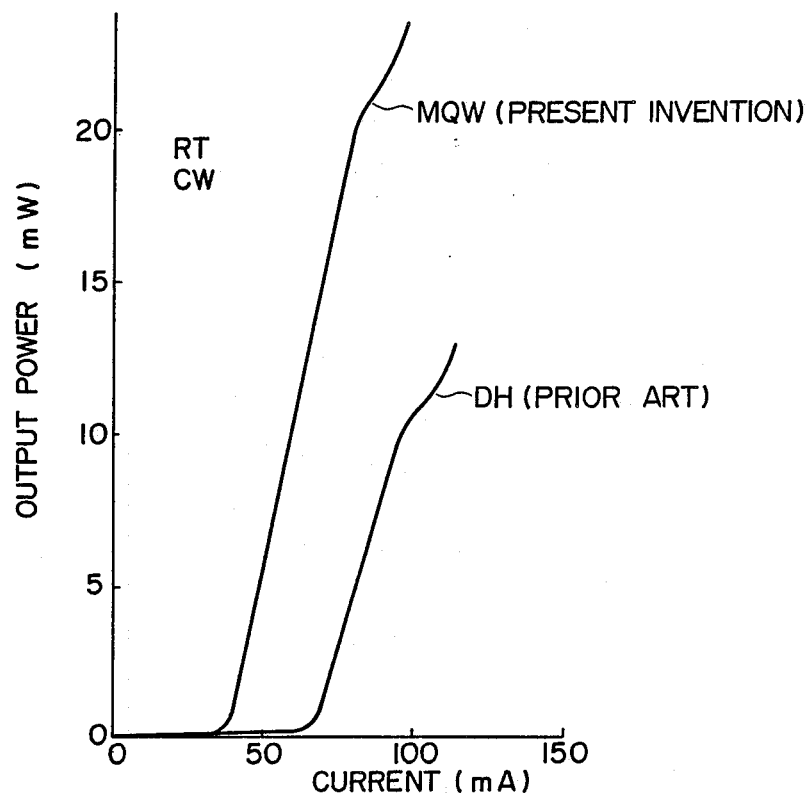
FIG. 2 is the light output power-injected current characteristics of the MQW self-sustained pulsating laser device of the present invention in FIG. 1 and a conventional regular DH-type self-sustained pulsating laser device.

FIG. 2 illustrates the light output power-injected current characteristics of the MQW laser of the particular of FIG. 1 and the regular DH laser. The oscillating threshold current was 35-40 mA in the MQW laser of the example 1, which was small by 30-40% compared to 65-70 mA of the regular DH laser. In addition, the MQW laser of the example 1 pulsated at the kink-free fundamental lateral mode up to 20-25 mW of a light output power, which was more than twice that of the regular DH laser. Since the laser changes to the single longitudinal mode beyond the kink level, the relative intensity noise cannot be reduced below $10^{-13}$ Hz$^{-1}$. Since, however, the multi-longitudinal mode self-sustained pulsation is obtained up to the kink level, the relative intensity noise was on the order of $5 \times 10^{-15}$-$5 \times 10^{-14}$ Hz$^{-1}$, lower than $10^{-13}$ Hz$^{-1}$ up, to 20-25mW of the light power output in the absence of optical feedback. Like this, in the absence of optical feedback, the relative intensity noise of the example 1 was suppressed satisfactorily below the intensity requirement of $10^{-13}$ Hz$^{-1}$ required as a light source for optical video discs, etc., so that a satisfactory low-noise characteristic from a low output power to a high output power was obtained. Even if optical feedback may be generated, low noise below the relative intensity noise of $10^{-13}$ Hz$^{-1}$ level is obtained if the self-pulsating frequency is controlled.

Figure 3:
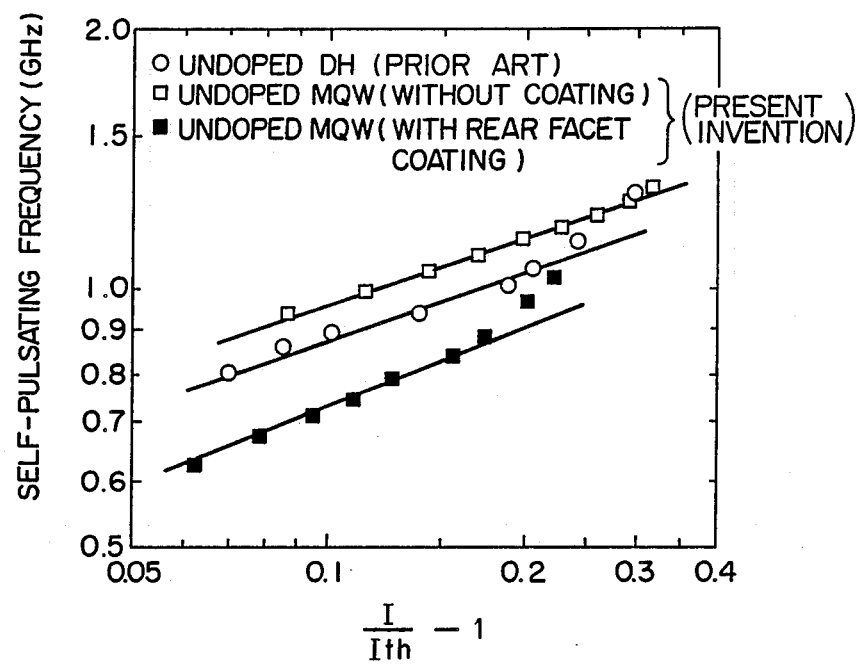
FIG. 3 illustrates the relationship between the self-pulsating frequency and drive current of the MQW self-sustained pulsating laser device of the present invention in FIG. 1 and the conventional regular DH-type self-sustained pulsating laser device.

If the active layer has an MQW structure, the differential gain increases, so that the self-pulsating frequency tends to be higher than that of the regular double heterostructure. Namely, as shown in the relationship between self-pulsating frequency and drive current of FIG. 3, the self-pulsating frequency (shown by small squares) of the MQW active layer is higher than that (shown by circlets) of the regular double heteroactive layer. However, self-sustained pulsating frequency can be suppressed by increasing the facet reflectivities. In the device, the self-pulsating frequency was reduced by coating the opposite face of the cavity from the laser beam emission facet with a high-reflective film of a reflectivity of 90%. In this device, the relative intensity noise was suppressed lower than $10^{-13}$ Hz$^{-1}$ even if 3-6% of optical feedback was generated in 50-80 mm of the optical path between an optical disc and the laser device in the optical pickup system. The self-pulsating frequency was successfully lowered than 1.3 GHz in an optical power output of 20 mW. Although optical feedback is produced at an optical output of 5-20 mW, the relative intensity noise was suppressed within a range of $8 \times 10^{-15}$-$8 \times 10^{-14}$ Hz$^{-1}$, and thus a satisfactory low-noise characteristic for a light source for an optical video disc was realized.

By applying a facet refractivity lowering antirefractive film to the front facet of the cavity and a facet refractivity increasing refractive film to the rear facet of the cavity, the self-pulsating area was expanded successfully and the above low-noise characteristic was obtained in an optical output power range of 5-50 mW.

When the device of the particular example had antireflective and reflective coatings, the kink power level was 70-80 mW and the catastrophic optical damage level was 90-100 mW. At durability test, the device was not deteriorated although it was operated at a surrounding temperature of 50° C. and at automatic controlled power of 40 mW for 2000 hours or more.

According to the particular example, by constituting the active layer so as to have a multiquantum well (MQW) structure, the maximum optical output power which enables self-pulsation and the kink power level were successfully increased twice-three times and the threshold current was reduced by 30-40% compared to the regular double hetero (DH) structure. When the cavity facets had antirefractive and refractive coatings, 70-80 mW of the kink level and 50-60 mW of the self-pulsating optical output power were obtained. In addition, although the differential gain increases and the self-pulsating frequency increases if an MQW active layer is employed, the differential gain was reduced by coating the rear facet of the cavity with a high-refractive film. Therefore, the self-pulsating frequency of the device was successfully suppressed to about 0.2-1.0 GHz up to an optical output power of 25-30 mW. Thus, even if 3-6% of optical feedback was generated in an optical pickup system optical path of 50-80 mm in an optical video disc system, the relative intensity noise was successfully suppressed lower than $10^{13}$ Hz$^{-1}$.

Like this, the high-power low-noise characteristic of the semiconductor laser device according to the present invention was improved compared to the conventional device.

The use of the MQW active layer improved the temperature characteristic of the device threshold current. A device having antirefractive and refractive coatings was not deteriorated at durability test even if 2000 hours passed at a surrounding temperature of 50° C. at an automatic controlled power of 40 mW.

While in the particular example the crystal material used was of AlGaAs system, other materials such as AlGaInP/GaAs system, InGaAsP/InP system materials, etc., may be used.

EXAMPLE 2

Figure 4:
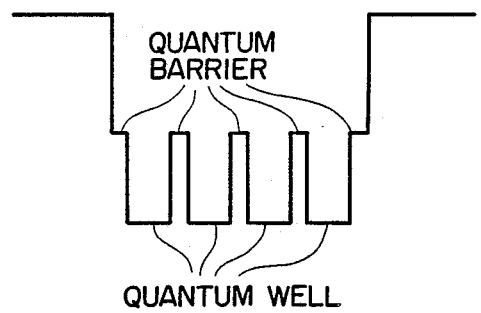
FIG. 4 schematically illustrates a conduction band energy structure of the multiquantum well structure of the MQW self-sustained pulsating laser device of the present invention in FIG. 1.

FIG. 1 is also a cross section view of a semiconductor laser device as a second embodiment 2 of the present invention. FIG. 4 schematically illustrates the conduction band energy structure of a multiquantum well structure constituting the active layer of the laser device.

Reference numeral 1 denotes an n-GaAs substrate; 2, an n-GaAs buffer layer; 3, an n-$Al_xGa_{1-x}As$ cladding layer (lower cladding layer); 4, the AlGaAs active layer of a multiquantum well structure; 5, a p-$Al_xGa_{1-x}As$ cladding layer (upper cladding layer); 11, a ridge stripe formed integrally at the central portion of the p-$Al_xGa_{1-x}As$ cladding layer 5; 6, an oxidation-preventive p-GaAs layer for the ridge stripe 11 formed on to of the stripe 11; 7, an n-GaAs block layer (light-absorbing and current-blocking layer); 8, a p-GaAs buried layer; 9, a p-side electrode and 10, an n-side electrode.

This device is fabricated as follows. First, sequentially grown epitaxially on the 100 μm-thick n-GaAs (001) substrate 1 by the crystal growth technique such as metalorganic chemical vapor deposition (MOCVD) or molecular beam epitaxy (MBE) are the 0.3–0.5 μm-thick buffer layer 2; the 1.0–1.5 μm-thick $Al_xGa_{1-x}As$ cladding layer 3 (x=0.45–0.55), and the active layer 4, of a multiquantum well structure (The multiquantum well structure active layer 4 is formed of an alternate laminate of five $Al_yGa_{1-y}As$ quantum barriers (y=0.20–0.30), each being 3–6 nm thick, and four $Al_zGA_{1-z}As$ quantum wells (z=0–0.10), each being 10–15 nm thick. The overall thickness of the active layer is 0.05–0.08 μm); the 1.0–2.5 μm-thick p-$Al_xGa_{1-x}As$ cladding layer 5 (x=0.45–0.55); and the 0.2–0.4 μm-thick p-GaAs layer 6. Subsequently, a $SiO_2$ insulator film (not shown) is formed and a stripe mask pattern is formed in the insulator film by photolithography. Thereafter, the layers 6 and 5 are etched 0.5–1.5 μm deep with a hydrophosphoric acid solution to form a ridge stripe structure. The n-GaAs blocking layer 7 is selectively grown epitaxially by chemical vapor deposition such that the blocking layer 7 is flush with the ridge with the $SiO_2$ insulator film mask being left. Thereafter, this mask is etched away with a hydrofluoric solution and the p-GaAs contact layer 8 (1.0–2.0 μm thick) is grown. The p-side electrode 9 and n-side electrode 19 are deposited, and the resulting wafer is cleaved and scribed to cut away a device from the wafer.

Among the respective device structural parameters, preferably, the ridge top horizontal width $S_1$ is 2–4 μm and the horizontal ridge bottom width $S_2$ is 4–7 μm. Preferably, the overall thickness of $d_a$ of the active layer 4 is 0.05–0.08 μm, and especially 0.055–0.065 μm. One or both of n- and p-type impurities may be doped in a concentration of $1\times10^{18}-\times10^{19}$ cm$^{-2}$ in the active layer. The thickness $d_c$ of the cladding layer 5 including the thickness (height) of the ridge stripe (the thickness of the layer 5 before etching) is preferably 1.0–3.0 μm and more preferably 1.3–1.8 μm. The thickness $d_1$ of the cladding layer 5 on each side of the ridge on which no stripes are formed (the thickness of the etched portion of the layer 5) is preferably 0.2–0.6 μm, and more preferably 0.3–0.5 μm. In the particular example, in a device with no facet coating, a self-sustained pulsation was obtained at a threshold current of 20–30 mA and at a light output power of 2–7 mW, and the kink power was 40–50 mW. In a device with refractive and antirefractive facet coatings, a self-pulsation was obtained at a light output of 2–12 mW and the kink power was 80–100 mW. Like this, the device of the particular example by itself successfully provided a high power characteristic in which a light output power of 40–50 mW or more was obtained which was required for writing and erasing data in a memory in an optical disc, and a low noise characteristic in which the relative intensity noise was $10^{13}$–$10^-$Hz$^{-1}$, which was lower than a limit below which memory reading was possible, at a light output power of 2–10 mW even if optical feedback occurred.

The device operated with high reliability or without noticeable deterioration being recognized even after a lapse of about 2000 hours under APC (automatic power control) conditions in which the temperature was maintained at 50° C. and the light output power was maintained at 50 mW. The semiconductor laser device of the particular example satisfied the high-power low-noise characteristic required for an optical source for erasable optical disc.

EXAMPLE 3

Figure 5:
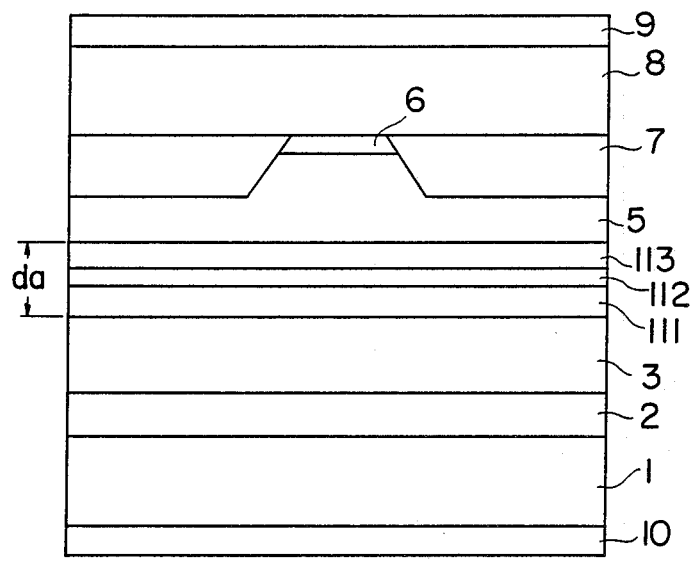
FIG. 5 is a cross section view of a SQW self-sustained pulsating semiconductor laser device as an another embodiment of the present invention.
Figure 6:
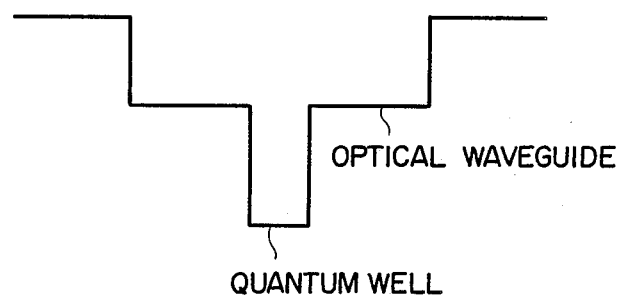
FIG. 6 schematically illustrates the conduction band energy structure of a single quantum well structure.

FIG. 5 is a cross section view of Example 3, a semiconductor laser device according to another embodiment of the present invention. FIG. 6 schematically illustrates the conduction band energy structure of a single-quantum well structure constituting the active layer of the laser device.

This embodiment is the same as the second embodiment in Example 2 except in the active laser structure. In more detail, the active layer of the Example 2 employed the multiquantum well structure while the active layer of Example 3 employs a single-quantum well structure. Example 3 is the same in device fabricating process as Example 2 except for the active layer.

The active layer of Example 3 includes an $Al_\alpha Ga_{1-\alpha}As$ single quantum well layer 112 (10–30 nm thick, $0 \leq \alpha \leq 0.15$), an n-$Al_\beta Ga_{1-\beta}As$ layer 111 and a p-$Al_\beta Ga_{1-\beta}As$ layer 113 (the layers 111 and 113 each being 15–40 nm thick, $0.15 \leq \beta \leq 0.35$) which function as a quantum barrier and cladding layer, respectively, provided on an upper and a lower surfaces of the well layer 112. The layers 111 and 113 may have a multiquantum well structure (for example, 4–10 nm thick), a superlattice layer-formed well structure (for example, 1–4 nm thick) or a graded-index layer, or may be doped separately or together with at least one of n- and p-type impurities in a range of from $1\times10^{18}-1\times10^{19}$ cm$^{-3}$.

The device of Example 3 produces effects similar to those produced by Example 2. In addition, since the particular example 3 employed the single quantum well structure, laser oscillation was possible at low carrier density, and the threshold current was reduced to 10–20 mA.

While in Examples 2 and 3 the material is of the AlGaAs system, other materials, for example, of AlGaInP/GaAs, InGaAsP/InP, and InGaAs/GaAs systems may be used to produce similar effects.

As described above, in the semiconductor laser devices of Example 2 and 3, self-pulsation can be obtained by controlling the effective transverse refractive index difference of the active layer, the light output power which enables self-pulsation can be controlled, and the kink power is improved compared to the conventional device, so that the devices can be used as a light source for an erasable optical discs. In more detail, the device by itself can satisfactorily provide both a high power characteristic in which high power such as 40–50 nW or more required for writing and erasing data in an optical disc is obtained, and a low-noise characteristic in which the relative intensity noise is reduced to $10^{13}$–$10^{14}$ Hz$^{-1}$ for enabling the memory reading at a light output power of 2–10 mW even if optical feedback occurs, and thus the device can directly overwrite in an optical disc memory. In a device with antirefractive and refractive facet coatings, no noticeable deteriorations were recognized after a lapse of 2000 hours in an accelerated lifetime test under an APC operation of an light output power of 50 mW at a temperature of 50° C.

EXAMPLE 4

Figure 7:
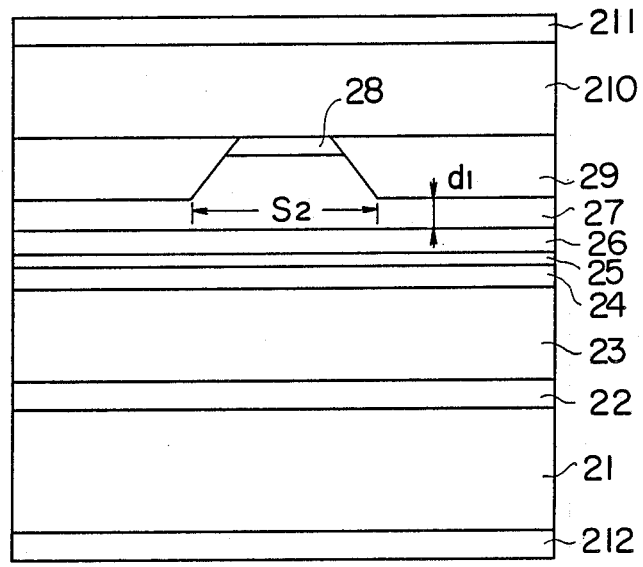
FIG. 7 is a cross section view of a self-sustained pulsating semiconductor laser device as yet another embodiment of the present invention.
Figure 8:
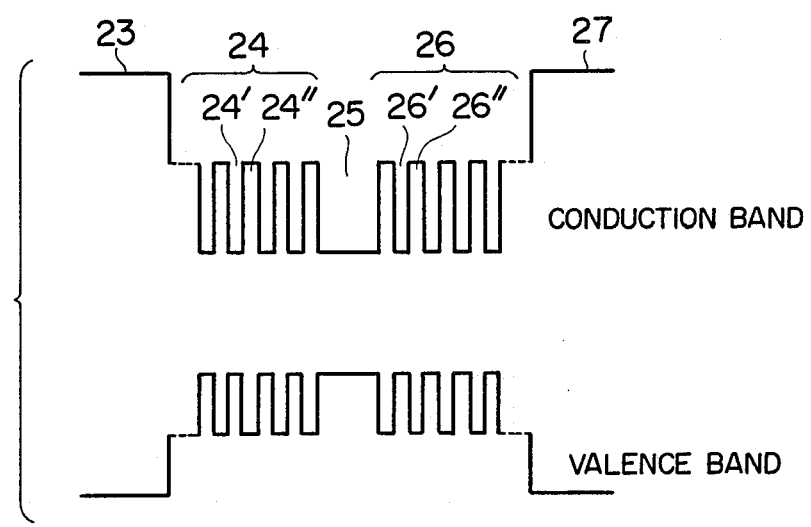
FIGS. 8–11 each schematically illustrates the energy band structure of the active layer in each of the for the configuration of FIG. 7.

Example 4 of the present invention will now be described with reference to FIG. 7. First, sequentially grown epitaxially on an n-GaAs (001) substrate 21 (100 μm thick) by MBE or MOCVD are an n-GaAs buffer layer 22 (0.5 μm thick), an n-$Al_xGa_{1-x}As$ cladding layer 23 (1.0–1.5 μm thick, x=0.45–0.55), an undoped or n- or p-multiquantum well layer 24 (of three-six alternate quantum barriers and wells, each quantum barrier including an $Al_yGa_{1-y}As$ layer 2–5 nm broad, y=0.20–0.45, and each quantum well including an $Al_zGa_{1-z}As$ layer 3–10 nm broad, z=0–0.20, or of ten-fifteen alternate $Al_yGa_{1-y}As$ superlattice barriers (each being 0.5–1 nm broad) and $Al_zGa_{1-z}As$ superlattice wells (each being 0.5–2 nm broad) in order to constitute an energy band structure of a conduction band and a valence band in the active layer as shown in FIG. 8.), undoped single-quantum well layer 25 (of $Al_{z'}Ga_{1-z'}As$ layer 10–30 nm broad, z'=0–0.15), an undoped or n- or p-type multiquantum well layer 26 (of three-six $Al_yGa_{1-y}As$ quantum barriers (each being 2–5 nm broad, y=0.20–0.45) and $Al_zGa_{1-z}As$ quantum wells (each being 3–10 nm broad, z=0–0.20), or of ten-fifteen alternate $Al_yGa_{1-y}As$ superlattice barriers (each being 0.5–1 nm broad) and $Al_zGa_{1-z}As$ superlattice wells (each being 0.5–2 nm broad)), a p-$Al_xGa_{1-x}As$ cladding layer 27 (1.3–1.6 μm thick, x=0.45–0.55), and a p-GaAs layer 28 (0.2–0.3 μm thick). A $SiO_2$ film is then formed and a stripe mask pattern is prepared by photolithography. This stripe $SiO_2$ film is used as a mask and the layers 28 and 27 are etched with a hydrophosphoric acid solution to form a ridge-like optical waveguide. Thereafter, an n-GaAs current block layer 29 (0.7–1.0 μm thick) is selectively deposited with the $SiO_2$ film mask being left. Subsequently, the $SiO_2$ film mask is etched away with a hydrofluoric solution, and a p-GaAs cap layer 210 (1.0–2.0 μm thick) is grown on the layers 28 and 29. Thereafter, a p-type layer side electrode 211 and an n-type layer side electrode 212 are formed, and a device is cut away from the resulting wafer in a cleaved and scribed process.

In the particular example, in order to cause a laser oscillation at the fundamental lateral mode and at a low threshold current, an appropriate ridge bottom stripe width $S_2$ was 4–6 μm. When the cladding layer thickness $d_1$ was 0.3–0.6 μm after the ridge waveguide was formed, a laser device which caused a self-pulsation was obtained. The particular device caused a laser oscillation at a threshold current of 10–20 mA and performed a self-pulsation at an optical output power of 2–30 mW. The kink output power was 50–60 mW. In a laser device in which n-type or p-type impurities are doped at a density of $1 \times 10^{18}$–$1 \times 10^{19}$ cm$^{-3}$ in the multiquantum well layer of the active layer, laser oscillation occurred at a threshold current of 10–20 mA and the self-pulsating frequency was controlled successfully depending on the polarity and density of the dopants.

In a laser device with reflective and anti-reflective facet coatings, self-pulsation occurred at a light output power of 2–50 mW, and the kink output power was 80–90 mW. A laser device was realized in which the overall thicknesses of the active and cladding layers were controlled to have respective predetermined values (the active layer was 0.04–0.08 μm thick and the cladding layer was 0.3–0.6 μm thick) such that a self-pulsation occurred at a light output power of 2–10 mW and the kink output power was 110–120 mW. Thus, the device by itself satisfied a high-power low-noise characteristic required for a light source for writing and erasing data in an optical disc and a light source for reading data from an optical disc.

EXAMPLE 5

Figure 9:
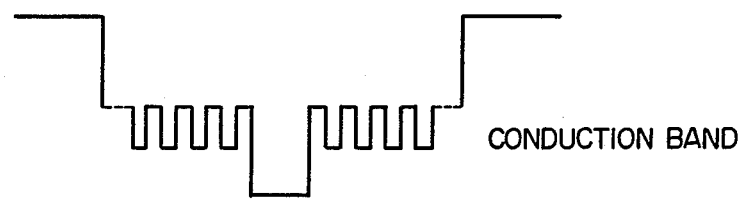

Example 5 is another embodiment of the present invention and will now be described with reference to FIG. 9 which schematically illustrates the energy band structure of a conduction band in the active layer. In the laser device fabricated, the number of Al elements z in the $Al_zGa_{1-z}As$ quantum well of each of the multiquantum well layers 24 and 26 provided on the upper and lower surfaces of the single quantum well layer in the active layer was selected to be larger than the number of Al elements z' in the $Al_{z'}Ga_{1-z'}As$ single quantum well layer 5. The structure of the multiquantum well layers 24 and 26 was designed such that the quantized energy level formed in the multiquantum well layer was the same as, or higher than, that formed in the single quantum well layer. According to the particular example, the threshold current was further reduced and laser oscillation was successfully performed at 5–10 mA. Other characteristics similar to those in the Example 1 were obtained.

EXAMPLE 6

Figure 10:

Example 6 is another embodiment of the present invention and will now be described with reference to FIG. 10 which schematically illustrates the energy band structure of a conduction band in the active layer. In the laser device fabricated, the $Al_zGa_{1-z}As$ quantum wells 24', 24" ...; 26', 26" ... of the multiquantum well layers 24 and 26 provided on the upper and lower surfaces of the single quantum well layer in the active layer were selected so as to increase gradually in width and in the number of Al elements from the single quantum well 25 toward the cladding layers 23 and 27. The structures of the multiquantum well layers 24 and 26 were designed such that the quantized energy level formed in the multiquantum well layer was the same as, or higher than, that formed in the single quantum well layer. Example 6 produced effects similar to those produced by Example 5.

EXAMPLE 7

Figure 11:
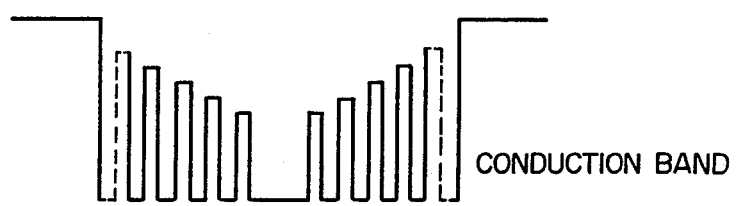

Example 7 is another embodiment of the present invention and will be described with reference to FIG. 11 which schematically illustrates the energy band structure of a conduction band in the active layer. In the laser device fabricated, the multiquantum well layers 24 and 26, respectively, provided on the upper and lower surfaces of the single quantum well layer in the active layer were a graded-index layer in which the number of Al elements y of the $Al_yGa_{1-y}As$ quantum barrier was selected so as to increase from the single quantum well later toward the cladding layers. In the device, the quantized energy levels formed in the quantum wells of the multiquantum well layer were selected so as to increase gradually from the single quantum well layer to the cladding layers. The particular example also produced effects similar those by Example 5.

According to Examples 4-7, it is possible to control the effective transverse refractive index difference of the active layer of the single quantum well structure, so that it is easy to control the lateral and longitudinal modes to thereby provide a desired laser characteristic. In the laser devices of a ridge stripe structure shown in Examples 4-7, self-pulsation occurred and the kink output power was 50-60 mW at a light output power of 2-30 mW when the cladding layer was 0.3-0.6 μm thick and the overall thickness of the active layer was 0.05-0.08 μm after the ridge was formed. The threshold current was 5-10 mA. In a laser device with refractive and antirefractive facet coatings, self-pulsation occurred in a light output power range of 2-50 mW, and the kink output power was 80-90 mW. A device was obtained in which the effective transverse refractive index difference of the active layer was controlled such that self-pulsation occurred at a light output power range of 2-10 mW and the kink output power was 110-mW. Thus, these devices satisified a high power characteristic required for light sources for recording and erasing data in optical discs and a low-noise characteristic required for light sources for reading data in the discs.

While Examples 4-7 were described using AlGaAs materials, other materials such as AlGaInP/GaAs and InGaAsP/InP system materials may be used for the same purposes, of course.

EXAMPLE 8

Figure 12:
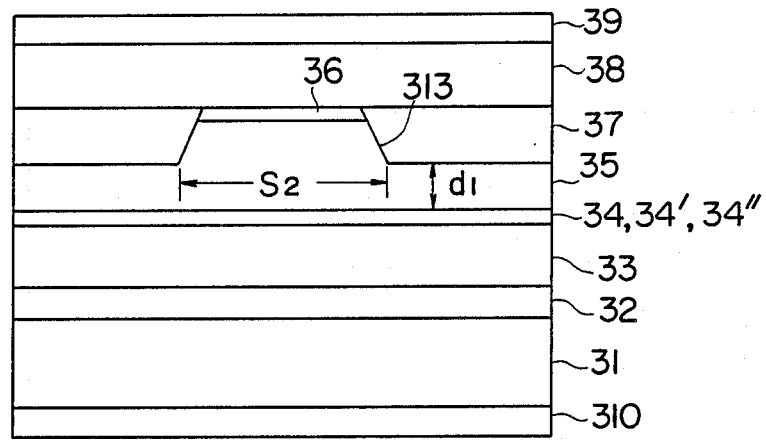
FIG. 12 is a cross section view of an MQW self-sustained pulsating laser device as yet another embodiment of the present invention.

An MQW self-sustained pulsation laser as Example 8 of another embodiment of the present invention will now be described with reference to FIG. 12. Sequentially deposited by crystalline growth on an n-GaAs substrate 31 by MOCVD or MPE are n-GaAs buffer layer 32 (0.5 μm thick), an n-$Al_xGa_{1-x}$As cladding layer 33 (1.5 μm thick, x=0.45), an AlGaAs multiquantum well structure active layer 34' (of an alternate laminate of five $Al_yGa_{1-y}$As quantum barriers, y=0.2-0.27, each barrier being 3-5 nm thick and four $Al_zGa_{1-z}$As quantum wells, z=0.04-0.07; with n-type impurities Se being doped uniformly in a concentration of $9 \times 10^{17}$-$2 \times 10^{18}$ cm$^{-3}$ in the quantum barriers and wells), a p-$Al_xGa_{1-x}$As cladding layer 35 (1.3-1.6 μm thick, x=0.45), and a p-GaAs layer 36 (0.2 μm thick). Thereafter, an insulator film is formed on top of the resulting crystal, and a stripe-like insulator film mask is prepared by photolithography and etching. This mask is used to form a stripe-like ridge waveguide 313 in an etching process with a hydroiphosphoric acid solution as shown in FIG. 12. The layer 35 on each side of the ridge formed by etching had a thickness $d_1$ of from 0.3-0.6 μm, An n-GaAs current blocking layer 37 (0.7-1.1 μm thick) was selectively deposited with the insulator film mask left thereon. Thereafter, the mask was etched away with a hydrofluoridic acid solution, and a p-GaAs layer 38 (1.0-1.5 μm thick) was again deposited by crystal growth. Thereafter, a p-side electrode 39 and an n-side electrode 310 were deposited, and a device was cut away from the resulting wafer in a cleaving and scribing process.

An appropriate ridge stripe bottom width $S_2$ was 4-7 μm in order to provide a laser device which oscillates at the fundamental lateral mode in a stabilized manner. For comparison, a reference device was fabricated in which the active layer included an undoped AlGaAs multiquantum well layer 34 with other parameters being the same as the corresponding ones in the particular example.

Figure 14:
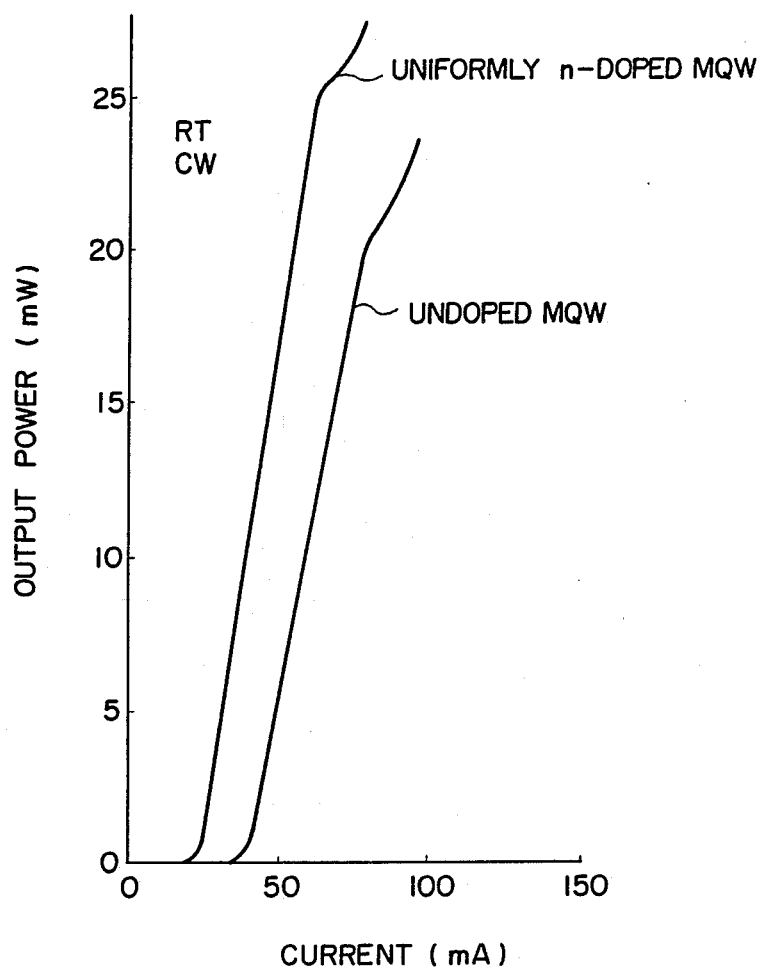
FIG. 14 illustrates the light output power-injected current characteristics of the device of the present invention.
Figure 15:
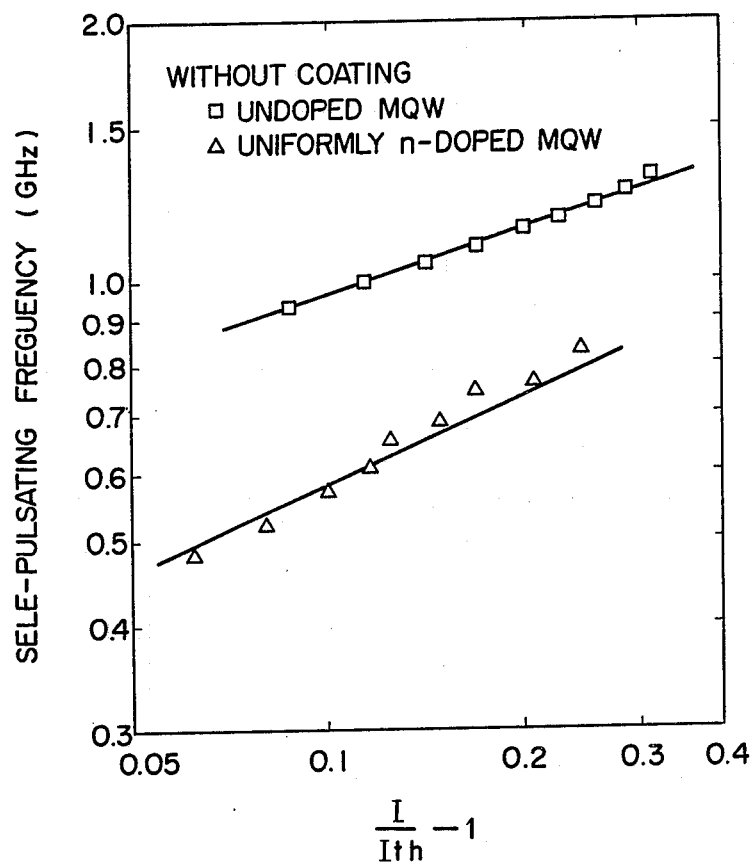
FIG. 15 illustrates the relationship between the self-pulsating frequency and the drive current of the device of the present invention.

Both in the device in which n-type impurities are doped in the active layer and in the device in which no n-type impurities are doped, self-pulsation was maintained up to the kink level. FIG. 14 shows the light output-power injected current characteristics of the device having the uniformly n-doped active layer and the device having the undoped active layer for comparing purposes. Since the device having the uniformly n-doped MQW active layer provides a high gain with a low injection carrier concentration compared to the device having the undoped active layer, the threshold carrier and current densities are reduced to thereby provide a reduced threshold current. As shown in FIG. 14, in the uniformly n-doped device, the threshold current is 25-30 mA which means a 20-30% reduction of the threshold current compared to 30-40 mA of the threshold current in the undoped device. In addition, the kink level of the particular device increased by 25-35 mW compared to the undoped device. According to the particular device, the relative intensity noise was below $10-13$ Hz$^{-1}$ up to the kink level. Since the differential gain of the MQW active layer is reduced by n-type doping, the self-pulsating frequency is reduced. As shown in FIG. 15, the self-pulsating frequency was reduced to ½-⅓ in the uniformly n-doped device (shown by △) compared to the undoped device (shown by □). In the particular example, the self-pulsating frequency was further reduced by applying a high reflective coating to the facet opposite to the emission face of the example. Thus, the self-pulsating frequency was maintained successfully at 1.0 GHz or less up to a kink level of 25-30 mW and the relative intensity noise was suppressed below $10^{-13}$ Hz$^{-1}$ although 3-6% of optical feedback occurred. In the device with the reflective and anti-reflective facet coatings, the kink level was increased to 60-70 mW.

In the particular device with the refractive and anti-refractive facet coatings, the catastrophic optical damage level was 80-90 mW. The device operated satisfactorily without noticeable deterioration for more 2000 hours at a surrounding temperature of 50° C. at an automatic controlled power of 40 mW at lifetime test.

EXAMPLE 9

Example 9 is another embodiment of the invention and will now be described with reference to FIG. 12. The process for fabricating the device was similar to that for Example 8 except that impurities of Se were doped only in the quantum barrier of the MQW active layer 34″ in crystal growth to thereby fabricate a modulated n-doped device. The doping level of the impurities of Se was set to $9 \times 10^{17}$-$2 \times 10^{18}$ cm$^{-3}$. Also in this device, a stabilized self-pulsation was obtained and continued up to the kink level. In the device of the particular example, the threshold current was 20-25 mA which was substantially the same as, or lower than, that in the example 8. The self-pulsating frequency was also suppressed to substantially the same as, or less than, that in the example 8. Thus, the self-pulsating frequency was maintained at 1.0 GHz or less up to the kink level. Even if optical feedback of 3–6% occurred, the relative intensity noise was suppressed to $10^{-13}$ Hz$^{-1}$ or less.

EXAMPLE 10

Figure 13:
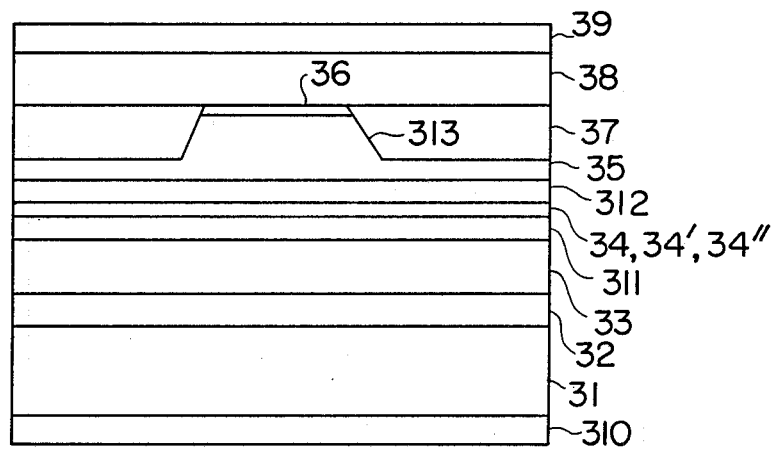
FIG. 13 is a cross section view of an MQW self-sustained pulsating laser device as another embodiment of the present invention.

An MQW self-sustained pulsating laser device as Example 10 of another embodiment of the present invention will now be described with reference to FIG. 13. The process for fabricating the device was similar to that for the example 8 except the use of a so-called GRIN-SCH (Graded-Index Waveguide Separate Confinement Heterostructure) in which n- and p-type AlGaAs graded-index layers 311 and 312 were provided on an upper and a lower surface, respectively, of the MQW active layer in the crystal growth process. The MQW active layer included a uniformly n-doped MQW active layer 34' or a modulated n-doped MQW active layer 34'' as in Example 8 or 9. Thus the threshold current obtained was 10–20 mA. The self-pulsation continued up to a kink level of 30 mW and the self-pulsating frequency was 0.2–1.0 GHz up to a light output power of 2–30 mW. Thus, the relative intensity noise was suppressed to $10^{-13}$ Hz$^{-1}$ or less even if optical feedback of 3–6% occurred.

According to the Example 8–10, the frequency of the self-sustained pulsating semiconductor laser device was reduced advantageously to $\frac{1}{2}$–$\frac{1}{3}$ of that of the conventional one. If the active layer is of a multiquantum well layer, the differential gain will increase and the self-pulsating frequency will increase compared to a regular bulk active layer. However, by the examples 8–10, the differential gain was reduced to substantially the same as, or less than, that provided by the bulk active layer. The self-pulsating frequency of the device was reduced to about 0.2–1.0 GHz up to a light output power of 25–30 mW, and the relative intensity noise was reduced to $10^{-14}$–$10^{-13}$ Hz$^{-1}$ even if optical feedback quantity of 3–6% occurred. In a device with reflective and anti-reflective facet coatings, self-pulsation was maintained up to 50–60 mW. A low noise characteristic was obtained in which the relative intensity noise was $10^{-14}$–$10^{-13}$ Hz$^{-1}$ even if optical feedback occurred at a light output power of 5–50 mW. By the Examples 8–10, the semiconductor laser provided high-output low-noise compared to the conventional one.

In a device with refractive and anti-refractive facet coatings, no deterioration was recognized even after a lapse of 2000 hours at a surrounding temperature of 50° C. and at an automatic controlled output power of 40 mW.

While the Examples 8–10 used AlGaAs system crystal materials, other materials such as AlGaInP/GaInP and InGaAsP/InP system materials may be used, of course.

EXAMPLE 11

Figure 16:
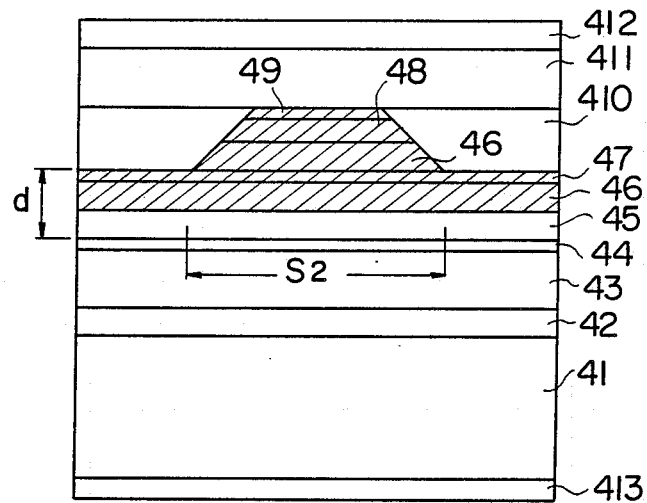
FIGS. 16–19 are cross section views of self-sustained pulsating laser devices as examples 11-14, respectively, of further embodiments of the present invention.

A laser device of another embodiment of an example 11 of the present invention is shown in FIG. 16. In fabrication, first, sequentially deposited on an n-GaAs substrate 41 (100 μm thick) by MOCVD are an n-GaAs buffer 42 (0.5 μm thick, $1 \times 10^{18}$ cm$^{-3}$ in impurity density), an n-Al$_x$Ga$_{1-x}$As cladding layer 43 (x=0.45, 1.0–1.5 μm thick, $9 \times 10^{17}$ cm$^{-3}$ in impurity density), an undoped Al$_y$Ga$_{1-y}$As active layer 44 (0.05–0.08 μm thick in total), a p-Al$_x$Ga$_{1-x}$As cladding layer 45 (x=0.45, 0.2–0.3 μm thick, $6 \times 10^{17}$ cm$^{-3}$ in impurity density), a highly p-type impurity doped Al$_{x'}$Ga$_{1-x'}$As cladding layer 46 (x'=0.5, 0.1–0.2 μm thick, $5 \times 10^{18}$–$5 \times 10^{19}$ cm$^{-3}$ in impurity density), a p-Al$_z$Ga$_{1-z}$As etch-block layer 47 (z=0, 3–10 μm thick, $1 \times 10^{18}$ cm$^{-3}$ in impurity density), a highly p-type impurity doped Al$_{x'}$Ga$_{1-x'}$As cladding layer 46' (x'=0.5, 0.1–0.2 μm thick, $5 \times 10^{18}$–$5 \times 10^{19}$ cm$^{-3}$ in impurity density), a p-Al$_x$Ga$_{1-x}$As cladding layer 48 (x=0.45, 0.4–0.6 μm thick, $6 \times 10^{17}$ cm$^{-3}$ in impurity density), and a p-GaAs cap layer 49 (0.2 μm thick, $5 \times 10^{18}$–$5 \times 10^{19}$ cm$^{-3}$ in impurity density).

Thereafter, a stripe-like insulator film mask (of SiO$_2$ 0.2–0.3 μm thick) is prepared (not shown). Initially, a p-GaAs layer 9 is chemically etched with a non-selective etchant, for example, of a mixed solution of hydrophosphoric acid, hydroperoxide and ethylene glycol, and then up to the etch-stop layer 47 with a selective etchant, for example, of a mixed aqueous solution of hydrochloric acid and water.

The half-finished product is then heated to 800°–850° C. higher than a regular growth temperature of 650°–700° C. in the MOCVD growth furnace and annealed while being supplied with AsH$_3$ for 3–30 minutes. The half-finished product was then placed again in the furnace and n-GaAs current-blocking and absorbing layer 410 was grown again in the growth furnace with the insulator film mask being left. At this time, the compositions of the etch-block layer 47 and the layers below and above the block layer 47 were disordered (shown hatched) due to the interaction of these layers and the composition of the etch-block layer 47 area became high. Subsequently, the temperature was lowered continuously to the growth temperature 650°–700° C. to selectively grow the n-GaAs blocking layer 410 (0.6–0.9 μm thick, $3$–$5 \times 10^{18}$ cm$^{-3}$ in density).

The half-finished product was taken temporarily out of the furnace and the mask was removed. Furthermore, the half-finished product was returned into the growth furnace to deposit a p-GaAs cap layer 411 (1.0–1.5 μm thick, $2 \times 10^{18}$–$1 \times 10^{19}$ cm$^{-3}$ in impurity density) by crystal growth. A p-electrode 412 and an n-electrode 413 are deposited, and the resulting half-finished product is then cleaved and scribed, and a device is cut away.

In order to cause a stabilized laser oscillation at the fundamental lateral mode in the particular example, the stripe width S was preferably 3–8 μm and more preferably 4–6 μm.

The optical waveguide layer other than the ridge portion of the ridge waveguide structure was prepared to have the total d of the thicknesses of the layers 45, 46 and 47 with high controllability and with the accuracy of crystal growth conditions.

When the total thickness d was 0.2–0.3 μm, laser longitudinal mode was a single mode, and, where the total thickness d was 0.4–0.6 μm, a self-pulsating oscillation occurred at a multi-longitudinal mode. The threshold current was low when the total d was small; namely, when the total d was 0.2–0.3 μm, the threshold current was 30–40 mA, and when the total d was 0.4–0.6 μm, the threshold current was 50–60 mA. The kink output power was 40–50 mW when the total thickness d was 0.2–0.3 μm, and 10–20 mW when the total d was 0.4–0.6 μm. By control of the total thickness d, a laser device was fabricated with high reproducibility which satisfied a high output characteristic for an optical disc or a low-noise characteristic for a video disc.

EXAMPLE 12

Figure 17:
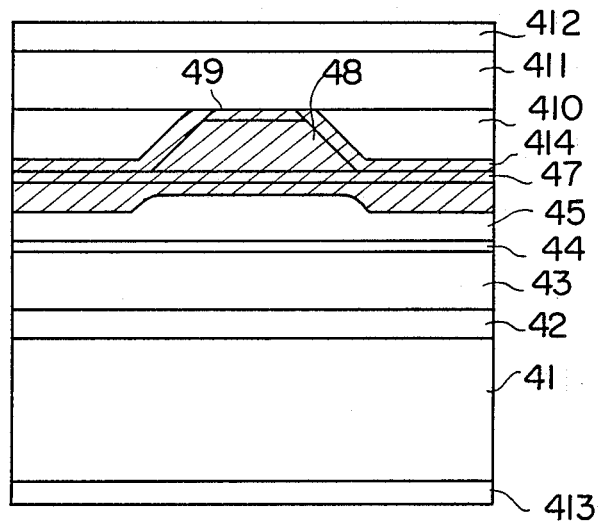

Example 12 of another embodiment of the present invention will be shown in FIG. 17. The laser device of the example 12 was fabricated in a process similar to that used for fabricating Example 11. An upper cladding layer 48 and a cap layer 49 were etched until the etch-block layer 47 was reached, a highly p-type impurity doped gas layer 414 was selectively deposited, and then an n-GaAs block layer 410 was deposited selectively.

Subsequently, the resulting half-finished product was heated continuously up to 800°-850° C. higher than the regular crystalline growth temperature of 650°-700° C. and then was annealed for 10-30 minutes to thereby disorder the compositions of the etch-block layer 47 and the layers on the upper and lower surfaces of the blocking layer 47 by diffusing the impurities out of the p-GaAs layer 414 (as shown hatched in FIG. 17). The temperature of 650°-700° C. to grow the n-GaAs blocking layer 410 selectively. This latter process is similar to that in the Example 11. Also by this particular example, a device was provided having performances similar to those of the Example 11.

EXAMPLE 13

Figure 18:
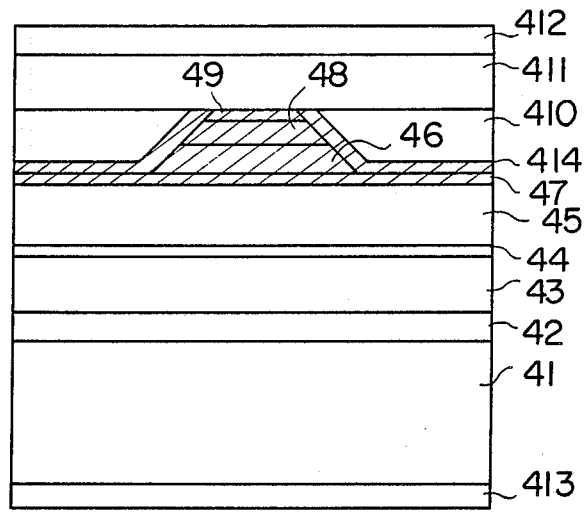

Example 13 of another embodiment the present invention will be described with reference to FIG. 18. The compositions of the etch-block layer 47 and the lower and upper cladding layers 45 and 46 were disordered sufficiently due to the interaction between these layers by providing the same highly impurity-doped layers 46 and 414 as those employed in Examples 11 and 12. Also in the particular example, the device characteristics similar to those of the Examples 11 and 12 were obtained.

EXAMPLE 14

Figure 19:
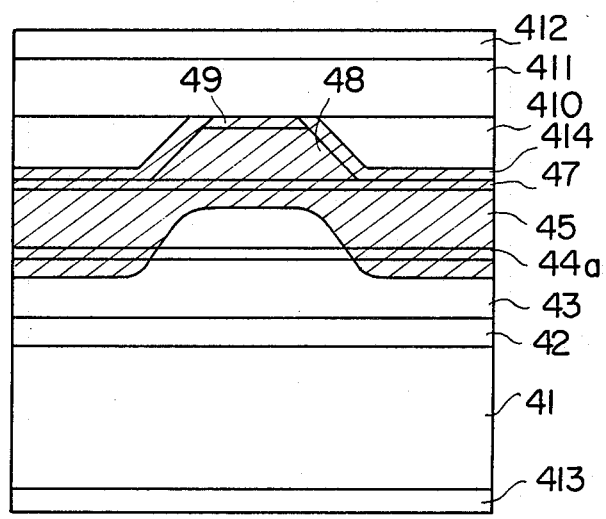

Example 14 of another embodiment of the present invention will now be described with reference to FIG. 19. The process for fabrication of a device was similar to those for Examples 12 and 13 but was different in that enough heat treatment process is performed to cause impurities to diffuse from a highly impurity-doped layer 49 to the active layer 44 except for in the ridge portion (as shown hatched). By such process, the active layer 44a corresponding to the area except the ridge portion was changed to a mixed crystal and the active layer 44b area corresponding to the ridge portion was a so-called buried structure. Thus, according to the device, the threshold current was 20-30 mA, the kink power was 60-70 mW and the catastrophic damage level was 100-110 mW.

According to Examples 11-14, the cladding layers of the semiconductor laser having a ridge waveguide structure was prepared so as to have a desired thickness with high controllability and high reproducibility compared to the conventional device and, therefore, the intended stabilized characteristics of the semiconductor laser was obtained. When the thickness of the cladding layer except for the ridge portion was controlled to 0.2-0.3 $\mu$m, a single longitudinal mode pulsating laser device was obtained in which the threshold current was 30-40 mA, the slope efficiency was 0.5-0.6 mW/mA and the kink output power was 40-50 mW. These devices had charactristics satisfying a high output charactristic required for an optical source for recording and erasing data in optical discs.

When the thickness of the cladding layers was controlled to 0.4-0.6 $\mu$m, a multi-longitudinal mode self-sustained pulsating layer device was obtained in which the threshold current was 50-60 mA, the slope efficiency was 0.4-0.5 mW/mA, and the kink output power was 10-20 mW. The device had a characteristic satisfying a low-noise characteristic (having a relative intensity noise of $10^{-14}$-$10^{-13}$ Hz$^{-1}$) required for a video disc optical source.

According to the methods of the Examples 11-14, the etch-block layer can produce the above effects easily without adversely affecting the laser characteritics by performing an annealing process alone in addition to the conventional techniques.

While Examples 11-14 have been described using the AlGaAs materials, AlGaInP or InGaAsP materials may be used to produce similar effects.

We claim:

1. In a semi-conductor laser device of a double heterostructure, an active layer comprising one selected from the group consisting of a single quantum well structure, a structure including a single quantum well layer and, an optical guiding layer of a multi-quantum well structure formed on each side of the single quantum well layer, and a multi-quantum well structure, and the device performing a self-sustained pulsation.

2. A semiconductor laser device according to claim 1, wherein the double heterostructure is formed on a semiconductor substrate and includes a first and a second cladding layers, the second cladding layer being disposed on the opposite side of the active layer from the semiconductor substrate and having a ridge stripe extending in the direction of extension of a laser cavity, a current-blocking and absorbing layer being provided on the second cladding layer on each of both the sides of the ridge stripe, the effective transverse refractive index difference of the active layer being in the range of $8 \times 10^{-4}$-$5 \times 10^{-3}$, and a pair of electrodes being electrically connected to the corresponding first and second cladding layers.

3. A semiconductor laser device according to claim 2, wherein the width of the ridge stripe on the side of the second cladding layer is larger than that of the ridge stripe remote from the second cladding layer.

4. A semiconductor laser device according to claim 3, wherein the facet of the laser cavity opposite to its emission facet is coated with a high refractive film.

5. A semiconductor laser device according to claim 3, wherein the active layer is 0.05-0.08 $\mu$m thick, an upper stripe width of the ridge stripe is 2-4 $\mu$m, a lower stripe width is 4-7 $\mu$m, the difference between the upper and lower stripe widths is 0.06-2.0 $\mu$m, the portion of the second cladding layer on which the ridge is formed is 1.0-3.0 ||m thick, and the portion of the second cladding layer on which no ridge is formed is 0.2-0.6 $\mu$m thick.

6. A semiconductor laser device according to claim 5, wherein a semiconductor layer of the same conductive type as the second cladding layer is formed on the ridge stripe on the second cladding layer, and wherein the semiconductor layer and the current blocking and absorbing layer are flush with each other on their boundary line.

7. A semiconductor laser device according to claim 6, wherein the semiconductor substrate is made of n-GaAs, the first cladding layer is made of n-AlGaAs, the second cladding layer is made of p-AlGaAs, the active layer includes a multiquantum well active layer, the quantum wells of the multiquantum well active layer are made of $Al_xGa_{1-x}As$ ($0 \leq x \leq 0.15$) and are 5-20 nm thick, the quantum barriers of the multiquantum well active layer are made of $Al_yGa_{1-y}As$ ($0.20 \leq y \leq 0.35$) and are 3-7 nm thick, the semiconductor layer is made of p-GaAs, and the current blocking and absorbing layer is made of n-GaAs.

8. A semiconductor layer device according to claim 6, wherein the semiconductor substrate is made of n-GaAs, the first cladding layer is made of n-AlGaAs, the second cladding layer is made of p-AlGaAs, the active layer includes a single quantum well active layer, the quantum well of the single quantum well active layer is made of $Al_xGa_{1-x}As$ ($0 \leq x \leq 0.15$) 10-30 nm thick and thinner than a thickness corresponding to the electron de Broglie wavelength, the quantum barrier is made of $Al_yGa_{1-y}As$ ($0.15 \leq y \leq 0.35$), the semiconductor layer is made of p-GaAs, and the current blocking and absorbing layer is made of n-GaAs.

9. A semiconductor laser device according to claim 8, wherein at least one of n- and p-type impurities is doped only in the quantum barrier of the single quantum well active layer, and the doping density of the impurities is $1 \times 10^{18}$-$1 \times 10^{19}$ cm$^{-3}$.

10. A semiconductor laser device according to claim 3, wherein the active layer includes a single quantum well layer and a pair of multiquantum well layers, one formed on each side of the single quantum well layer, and is 0.05-0.08 μm thick, the single quantum well layer is 10-30 nm broad, and the multiquantum well layer includes superlattice barriers each 0.5-1.0 nm broad and superlattice wells each 0.5-2.0 nm broad.

11. A semiconductor laser device according to claim 3, wherein the cladding layers are made of $Al_xGa_{1-x}$ ($0.45 \leq x \leq 0.55$), the multiquantum well layer includes quantum barriers made of $Al_yGa_{1-y}As$ ($0.20 \leq y \leq 0.45$) and quantum wells made of $Al_zGa_{1-z}As$ ($0 \leq z \leq 0.20$), and the single quantum well layer is made of $Al_{z'}Ga_{1-z'}As$ ($0 \leq z' \leq 0.15$).

12. A semiconductor laser device according to claim 11, wherein the Al composition, represened by z, of the $Al_zGa_{1-z}As$ of the quantum wells is larger than the Al composition, represented by z', of the $Al_{z'}Ga_{1-z'}As$ of the single quantum well layer.

13. A semiconductor laser device according to claim 11, wherein the Al composition, represented by z, of the $Al_zGa_{1-z}As$ of the quantum well includes a graded index layer in which the Al composition increases gradually from the single quantum well toward the first and second cladding layers.

14. A semiconductor laser device according to claim 12, wherein the respective wells and barriers of the multiquantum well layer are formed so as to have corresponding thicknesses and compositions such that the quantum energy level formed in the multiquantum wall layer is the same as, or higher than, the quantum energy level formed in the single quantum well layer.

15. A semiconductor laser device according to claim 13, wherein the respective wells and barriers of the multiquantum well layer are formed so as to have corresponding thicknesses and compositions such that the quantum energy level formed in the multiquantum well layer is the same as, or higher than, the quantum energy level formed in the single quantum well layer.

16. A semiconductor laser device according to claim 11, wherein one or both of n- and p-impurities are doped in the entire multiquantum well layer at a doping density of $1 \times 10^{18}$-$1 \times 10^{19}$ cm$^{-3}$.

17. A semiconductor laser device according to claim 16, wherein one or both of n- and p-type impurities are doped only in the quantum barrier of the multiquantum well layer at a doping density of $1 \times 10^{18}$-$1 \times 10^{19}$ cm$^{-3}$.

18. A semiconductor laser device of a double heterostructure comprising an active layer formed on a semiconductor substrate, a first and a second cladding layer, the second cladding layer being disposed on the opposite side of the active layer from the semiconductor substrate and having a ridge stripe extending in the direction of extension of a laser cavity, a current-blocking and absorbing layer provided on the second cladding layer on each of both the sides of the ridge stripe, the effective transverse refractive index difference of the active layer being $8 \times 10^{-4}$-$5 \times 10^{-3}$, n- and p-type impurities being together doped in the active layer, and a pair of electrodes being electrically connected to the corresponding first and second cladding layers, whereby self-pulsation is performed.

19. A semiconductor laser device according to claim 18, wherein the width of the ridge stripe on the side of the second cladding layer is larger than that of the ridge stripe remote from the second cladding layer.

20. A semiconductor laser device according to claim 19, wherein the active layer is one selected from the group consisting of a bulk active layer, a multiquantum well active layer and a single-quantum well active layer, and wherein the impurities are doped uniformly in the entire active layer.

21. A semiconductor laser device according to claim 19, wherein the active layer includes a multiquantum well active layer, and wherein the impurities are doped only in one of the quantum barriers and quantum wells of the multiquantum well active layer.

22. A semiconductor laser device according to claim 21, wherein the area in which the impurities are doped is narrower than the doped quantum barrier or quantum well.

23. A semiconductor laser device according to claim 22, wherein an area in which no impurities are doped is provided on each of both the sides of the area in which the impurities are doped.

24. A semiconductor laser device according to claim 21, wherein the n-type impurities which are doped in the multiquantum well active layer are at a doping density of $7 \times 10^{18}$-$1 \times 10^{19}$ cm$^{-3}$ and the p-type impurities doped are at a doping density of $5 \times 10^{17}$-$5 \times 10^{18}$ cm$^{-3}$.

25. A semiconductor laser device according to claim 24, wherein the doped n-type impurities are either Se or Si and the p-type impurities are either Be or Mg.

26. A semiconductor laser device according to claim 3 wherein the emission facet is coated with an antirefractive film and the opposite facet is coated with a refractive film.

27. A semiconductor laser device according to claim 11 wherein the Al composition, represented by y, of the $Al_yGa_{1-y}As$ of the quantum barrier includes a gradual index layer in which the Al composition increases gradually from the single quantum well toward the first and second cladding layer.

* * * * *

UNITED STATES PATENT AND TRADEMARK OFFICE
CERTIFICATE OF CORRECTION

PATENT NO. : 4,961,197
DATED : 2 October 1990
INVENTOR(S) : Toshiaki TANAKA et al.

It is certified that error appears in the above-identified patent and that said Letters Patent is hereby corrected as shown below:

| <u>Column</u> | <u>Line</u> | |
|---|---|---|
| 1 | 7 | After "particularly" insert --the present invention relates--. |
| 2 | 18 | After "another" insert --object--. |
| 2 | 62 | Change "having" to --has--. |
| 2 | 66 | Change "thickness in total." to --in total thickness.--. |
| 3 | 5 | Change "is" to --can be--. |
| 3 | 51 | Change "optimimized" to --optimized--. |
| 5 | 2 | Delete "in". |
| 5 | 9 | Change "a" to --the--; change "the" to --a--. |
| 6 | 9 | Before "well" delete "quantum". |
| 6 | 37 | After "semiconductor" insert --cladding--. |
| 6 | 52 | After "impurities" change "to" to --are--. |
| 7 | 5 | After "simultaneously" insert --,--. |

UNITED STATES PATENT AND TRADEMARK OFFICE
CERTIFICATE OF CORRECTION

PATENT NO. : 4,961,197

DATED : 2 October 1990

INVENTOR(S) : Toshiaki TANAKA et al.

It is certified that error appears in the above-identified patent and that said Letters Patent is hereby corrected as shown below:

| Column | Line | |
|---|---|---|
| 7 | 55 | Change "$f_p$" to --$f_p$--. |
| 9 | 53 | Change "46'0" to --46'--. |
| 10 | 40 | Delete "in each of the". |
| 11 | 35 | Before "of" insert --embodiment--. |
| 11 | 49 | Change "up," to --, up--. |
| 12 | 11 | Change "than" to --below--. |
| 13 | 16 | After "formed on" delete "to of". |
| 13 | 55 | Change "$1 \times 10^{18} - \times 10^{19}$ cm$^{-2}$" to --$1 \times 10^{18} - 1 \times 10^{19}$ cm$^{-3}$--. |
| 14 | 31 | Before "Example" delete "the". |
| 14 | 50 | Delete "the". |
| 14 | 51 | Delete "particular"; change "example" to --Example--. |
| 14 | 66 | Delete "an". |
| 15 | 10 | Before "light" change "an" to --a--. |
| 15 | 14 | After "Example 4" insert --is another embodiment--; after "invention" insert --and--. |

UNITED STATES PATENT AND TRADEMARK OFFICE
CERTIFICATE OF CORRECTION

PATENT NO. : 4,961,197

DATED : 2 October 1990

INVENTOR(S) : Toshiaki TANAKA et al.

It is certified that error appears in the above-identified patent and that said Letters Patent is hereby corrected as shown below:

| Column | Line | |
|---|---|---|
| 16 | 36 | Delete "the". |
| 17 | 57 | Change "hydroiphosphoric" to --hydrophosphoric--. |
| 19 | 10 | Change "the example 8" to --Example 8--. |
| 19 | 24 | Change "the Example" to --Examples--. |
| 20 | 20 | After "C." insert --,--. |
| 20 | 55 | Change "where" to --when--. |
| 21 | 3 | Delete "the". |

UNITED STATES PATENT AND TRADEMARK OFFICE
CERTIFICATE OF CORRECTION

PATENT NO. : 4,961,197

DATED : October 2, 1990

INVENTOR(S) : Toshiaki Tanaka et al

Page 4 of 4

It is certified that error appears in the above-identified patent and that said Letters Patent is hereby corrected as shown below:

| | | |
|---|---|---|
| 21 | 21 | After "temperature" insert --was then lowered to the crystal growth temperature--. |
| 21 | 23 | Delete "the". |
| 21 | 24-25 | Change "performances" to --characteristics--; delete "the". |
| 21 | 28 | After "embodiment" insert --of--. |
| 22 | 32 | Change "layers," to --layer,--. |
| 22 | 56 | Change "11m" to --,$\mu$m--. |
| 23 | 45 | Change "represened" to --represented--. |

Signed and Sealed this

Thirty-first Day of March, 1992

Attest:

HARRY F. MANBECK, JR.

*Attesting Officer*     *Commissioner of Patents and Trademarks*